United States Patent [19]

Amersfoort et al.

[11] Patent Number: 5,805,755
[45] Date of Patent: Sep. 8, 1998

[54] SELF-ALIGNED TRANSITION FROM RIDGE TO BURIED HETEROSTRUCTURE WAVEGUIDE, ESPECIALLY FOR MULTI-WAVELENGTH LASER ARRAY INTEGRATION

[75] Inventors: Martin Amersfoort, Eatontown; Chung-en Zah, Holmdel, both of N.J.

[73] Assignee: Tellium, Inc., Edison, N.J.

[21] Appl. No.: 664,599

[22] Filed: Jun. 17, 1996

[51] Int. Cl.$^6$ ........................................... G02B 6/10
[52] U.S. Cl. .............................. 385/131; 385/46; 385/14; 372/50; 372/48
[58] Field of Search ................................ 372/45, 48, 50, 372/102; 385/129–132, 14, 46

[56] References Cited

U.S. PATENT DOCUMENTS

| 4,809,288 | 2/1989 | Welch et al. ........................... 372/46 |
| 5,541,945 | 7/1996 | Yamaguchi et al. ..................... 372/45 |

OTHER PUBLICATIONS

Amersfoort et al., "Wavelength Accuracy and Output Power of Multiwavelength DFB Laser Arrays with Integrated Star Couplers and Optical Amplifiers," *Integrated Photonics Research*, Apr. 29–May 2, 1996, Boston, Massachusetts, *1996 Technical Digest Series*, vol. 6, pp. 478–481.

Brackett et al, "A scalable multiwavelength multihop optical network: a proposal for research on all–optical networks," *Journal of Lightwave Technology*, vol. 11, pp. 736–753, 1993.

Cha et al., "1.5μm band travelling–wave semiconductor optical amplifiers with window facet structure," *Electronics Letters*, vol. 25, 1989, pp. 242, 243.

Olsson et al., "Polarisation–independent optical amplifier with buried facets," *Electronics Letters*, vol. 25, 1989, pp. 1048, 1049.

Utaka et al., "Effect of Mirror Facets on Lasing Characteristics of Distributed Feedback InGaAsP/InP Laser Diodes at 1.5 μm Range," *IEEE Journal of Quantum Electronics*, vol. QE–20, 1984, pp. 236–245.

Young et al., "A 16×1 Wavelength Division Multiplexer with Integrated Distributed Bragg Reflector Lasers and Electroabsorption Modulators," *IEEE Photonics Technology Letters*, vol. 5, pp. 908–910, 1993.

Zah et al., "Multiwavelength Light Source with Integrated DFB Laser Array and Star Coupler for WDM Lightwave Communications," *International Journal of High Speed Electronics and Systems*, vol. 5, No. 1, pp. 91–109, 1994.

Zah et al., "Monolithic integrated multiwavelength laser arrays for WDM lightwave systems," *Journal of Optoelectronics—Devices and Technology*, vol. 9, pp. 153–166, 1994.

Zah et al., "Monolithic integration of a multiwavelength compressive–strained multiquantum–well distributed–feedback laser array with a star coupler and optical amplifiers," *Electronics Letters*, vol. 28, pp. 2361, 2362, 1992.

(List continued on next page.)

*Primary Examiner*—John Ngo
*Attorney, Agent, or Firm*—Charles S. Guenzer

[57] ABSTRACT

An opto-electronic integrated circuit including an active ridge waveguide (60), for example, a semiconductor laser diode, and a passive buried heterostructure semiconductor waveguide (64). The two types of waveguides are chosen for their respective tasks so as to minimize the lasing wavelength dependencies arising from fabricational variations and to simultaneously reduce the allowable bending radius, thus reducing the chip size. The two waveguides are coupled by a transition structure (62) including a laterally undefined slab waveguide. A fabricational method is described that self-aligns the ridge and buried heterostructure waveguides so that the transition loss is negligible. The method can be integrated with the fabrication of a window facet (118', 118") between an end of the ridge waveguide and the chip edge, which prevents unintended back reflections from the chip edge.

24 Claims, 10 Drawing Sheets

OTHER PUBLICATIONS

Zah et al., InP–Based Multiwavelength Laser Arrays with Integrated Combiners for WDM Systems, *Proceedings: IEEE Lasers and Electro–Optics Society, 1995 Annual Meeting*, San Francisco, California, Oct. 30–Nov. 2, 1995, vol. 2, pp. 239, 240.

Zah et al., "High Performance Multiwavelength Integrated DFB Laser Array," *Proceedings of Fifth Biennial DoD Photonics Conference*, McLean, Virginia, Mar. 26–28, 1996, pp. 167–170.

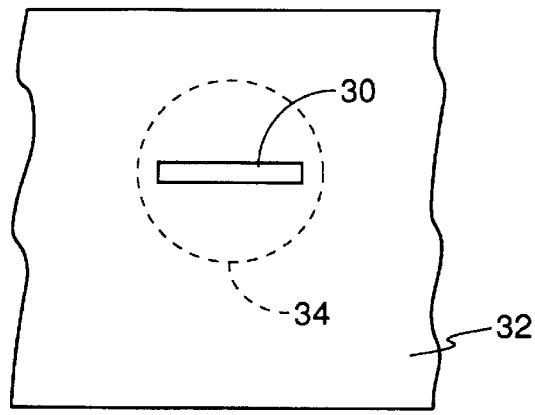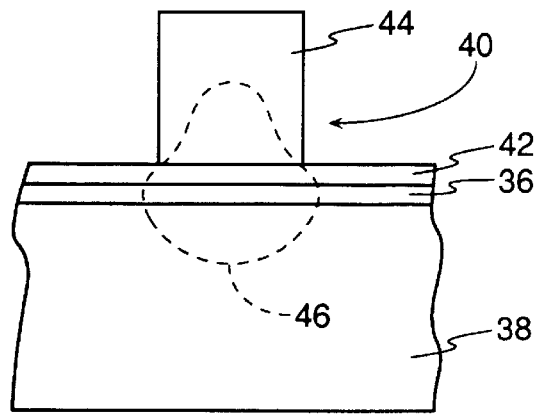
FIG. 2  FIG. 3
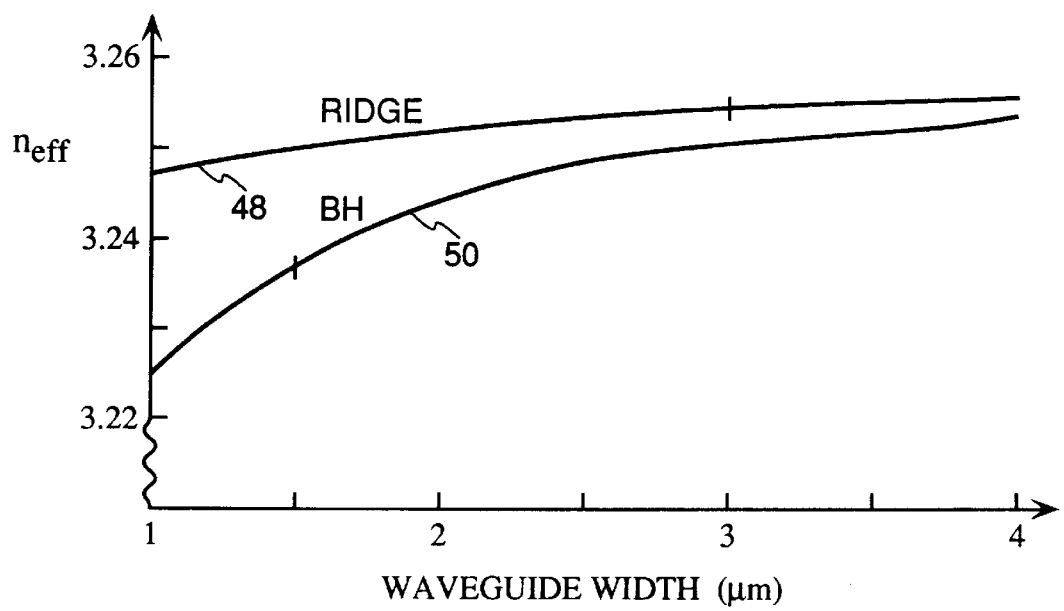
FIG. 4

SELF-ALIGNED TRANSITION FROM RIDGE TO BURIED HETEROSTRUCTURE WAVEGUIDE, ESPECIALLY FOR MULTI-WAVELENGTH LASER ARRAY INTEGRATION

GOVERNMENT INTEREST

This invention was partially developed under funding provided by the Advanced Projects Research Agency (ARPA) under contract MDA972-95-3-0027. The government has certain rights in this invention.

FIELD OF THE INVENTION

The invention generally relates to optical integrated circuits. In particular, the invention relates to a semiconductor laser integrated with a waveguide on an integrated circuit chip.

BACKGROUND ART

Communication systems and networks are increasingly relying upon optical fiber as the transmission medium. Typically, electrical data signals are used to modulate a laser which irradiates the transmission end of an optical fiber with a light beam of narrowly defined wavelength. The modulated optical carrier propagates to the receiver end of the fiber and is there detected by an optical detector, that is, an opto-electronic device that produces an electrical signal corresponding to the intensity envelope of the transmitted optical signal. Optical fibers have several advantages, including extremely high bandwidth, low interference, and relatively long transmission lengths without amplication or regeneration.

The bandwidth of optical fiber in a well designed system is measured in many terahertz ($10^{15}$ Hz) and greatly exceeds the speed (bandwidth) of the opto-electronics necessarily associated with the two ends of the fiber, the electronic bandwidth now approaching 10 gigahertz ($10^{13}$ Hz) in advanced systems. It was early recognized that the transmission capacity of an optical fiber could be increased several fold if different data signals were used to modulate laser sources of different wavelengths, and the different wavelength outputs were combined onto a single fiber. At the receiver end of the fiber, the different optical carriers are optically demultiplexed and the demultiplexed optical paths are separately detected. This architecture is referred to as wavelength-division multiplexing (WDM).

For WDM lightwave systems to become commercially viable, their cost must be reduced on a per-wavelength basis. One approach integrates many devices of similar functionality, such as laser arrays or detector-preamplifier arrays, onto a single optical integrated circuit since, for a N-wavelength system, the cost of the optical integrated circuit and its packaging depend only weakly upon N. Further savings are achieved by integrating onto the same chip many of the serial functions that are required, such as the laser or detector arrays, associated multiplexers or demultiplexers, and auxiliary optical waveguides between these elements and the inputs or outputs to the optical fiber. That is, for WDM transmission, it is advantageous to combine on the chip all the laser outputs of different wavelengths and then to couple the combined signal onto one single-mode fiber. This development has been described by Zah et al. in "Monolithic integrated multiwavelength laser arrays for WDM lightwave systems," *Journal of Optoelectronics—Devices and Technology*, vol. 9,pp. 153–166, 1994 and "Multiwavelength Light Source with Integrated DFB Laser Array and Star Coupler for WDM Lightwave Communications," *International Journal of High Speed Electronics and Systems*, vol. 5, no. 1, pp. 91–109, 1994. Such photonic integration not only simplifies the optical coupling between the laser array and the fiber but also reduces the packaging cost per wavelength since a single optical pigtail including an optical isolator is shared by all N wavelengths, and no packaging-level interconnects are required between the integrated elements.

Early work around 1977 showed how Y-branches could combine the outputs of six distributed-feedback (DFB) lasers onto one output waveguide. More recently, star couplers have been integrated with different types of laser arrays as described by Zah et al. in "Monolithic integration of a multi-wavelength distributed-feedback laser array with a star coupler and optical amplifiers," *Electronics Letters*, vol. 28, pp. 2361, 2362, 1992 and by Young et al. in "A 16×1 WDM transmitter with integrated DBR lasers and electro-absorption modulators," *IEEE Photonics Technology Letters*, vol. 11, pp. 736–753, 1993. This technology is useful in an all-optical network of the type described by Brackett et al. in "A scalable multiwavelength multihop optical network: a proposal for research on all-optical networks," *Journal of Lightwave Technology*, vol. 11,pp. 736–753, 1993.

In particular, we have fabricated multi-wavelength laser arrays with integrated star couplers and optical amplifiers that incorporate transmitter functions required of access modules to the WDM network. The invention has been successfully applied to this opto-electronic integrated circuit which presented many challenges.

A compact multi-wavelength laser array illustrated in plan view in FIG. 1 is integrated on a chip 10. Twenty distributed feedback (DFB) laser diodes (LDs) 12 have their separate optical outputs transmitted on respective passive waveguides 14 to a 20×4 star coupler 16 that combines the optical signals of different wavelengths. Four output waveguides 18 carry the outputs of the star coupler 16 to the edge of the chip 10 for selective coupling to an optical fiber. However, two optical amplifiers 20 of different lengths are positioned along some of the output waveguides 18 to amplify the combined optical signal before it starts its fiber transmission. The multiple output waveguides 18 provide redundancy and additional interconnect freedom.

For the multi-wavelength array of lasers 12 to be used in real systems, their wavelengths need to conform to the network specification, in particular the tolerance of the optical bandwidth required by the other wavelength-selective elements, such as filters, multiplexers, and demultiplexers. The lasing wavelength of a distributed feedback (DFB) laser shifts towards the red as a function of temperature at the rate of ~0.1 nm/° C. (12.5 GHz/° C. at a wavelength of 1.55 µm) as a result of the temperature dependence of the effective refractive index of the waveguide. This temperature dependence is advantageously used to controllably move as a group the wavelength comb of the laser array by adjusting the temperature of the heat sink to match the wavelength comb registration required by the system. Thus, assuming temperature control of the overall wavelength registration, the practicality of the multi-wavelength laser arrays depends mainly upon how accurately the wavelength spacings of the comb can be controlled during fabrication of the laser array. Once the opto-electronic chip has been fabricated within the required wavelength spacing, it can be expected to generate a stable and accurate wavelength comb during temperature-controlled operation since all the DFB lasers are commonly heat sunk. On the contrary, the implementation of a WDM transmitter array on discrete transmitters requires a wavelength (temperature) control of each channel. The common wavelength control afforded by an OEIC reduces the transmitter cost when measured per wavelength channel.

For a DFB laser array, the variation in wavelength spacing is primarily due to imperfections in the fabrication of the laser feedback grating and of the waveguide. Because all the wavelengths of the laser array must fall within the optical bandwidth accepted by the wavelength-selective devices in the network, e.g., the output diffractive grating and its optical detectors, the yield for devices incorporating such an array tends to significantly drop when the number of wavelengths increases. The yield can be increased by assigning more than one laser per wavelength and during testing subsequent to fabrication picking the set of lasers closest to the design specification for actual bonding.

Although the above approaches are useful for reducing the variations in inter-channel wavelength spacings, it is desired to still further reduce the variation of the lasing wavelength in a laser array integrated with associated optical waveguides.

SUMMARY OF THE INVENTION

The invention can be described as both the structure and its method of making of an optical integrated circuit in which a ridge waveguide is coupled to a buried heterostructure waveguide through a transition which includes a slab waveguide portion, which may be a laterally undefined section of the same layer that forms all or part of the buried heterostructure or ridge waveguide core. If the ridge waveguide is optically active having an active layer, the transition preferably includes also a passive ridge waveguide section in which the active layer is absent. The method preferably includes a self-aligned process of laterally defining the ridge and the buried heterostructure core with a single strip photomask. A similar method can be used to form a window facet between a ridge waveguide and a chip edge. The method of forming the window facet can be integrated with the process of forming the ridge waveguide, the buried heterostructure waveguide, and the transition therebetween.

BRIEF DESCRIPTION OF THE DRAWINGS

FIG. 2 is a schematic cross section of buried heterostructure waveguide.

FIG. 3 is a schematic cross section of a ridge waveguide.

FIG. 4 is a graph showing the effective refractive index as a function of waveguide width for both a ridge waveguide and a buried heterostructure waveguide.

DETAILED DESCRIPTION OF THE PREFERRED EMBODIMENTS

Figure 1:
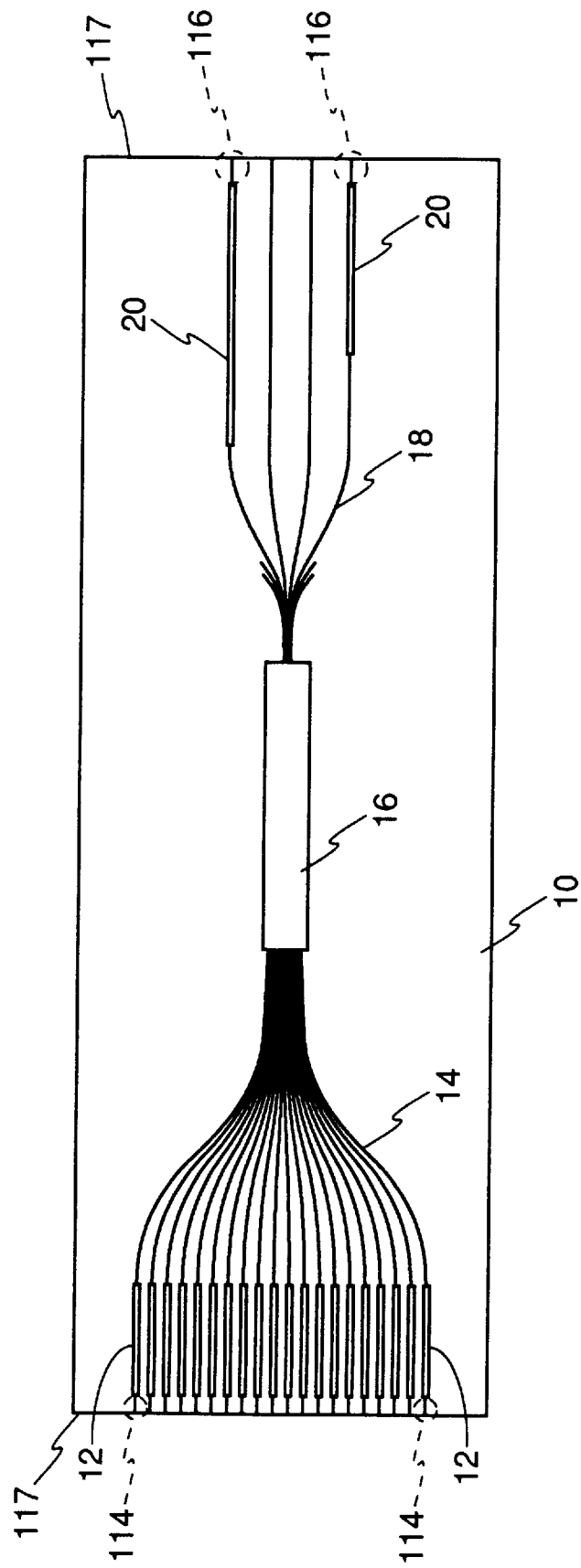
FIG. 1 is a plan view of an opto-electronic integrated circuit including both active and passive waveguides.

We have recognized that on one hand the active waveguides incorporated into the laser array and associated optical amplifiers and on the other hand the passive waveguides associated with the active elements present different and conflicting solutions to the accurate control of variability in lasing wavelength in the lasers and to compactness and low loss in the waveguides. As will be described below in greater detail, the requirement of wavelength control favors ridge waveguides in the active waveguiding region, but the requirement for compact, low-loss passive waveguides favors buried heterostructure waveguides.

In general, the lasing wavelength of each laser in a laser array needs to equal a Bragg wavelength $\lambda_0$ given by $$\lambda_0 = 2 n_{eff} \Lambda, \quad (1)$$

where $n_{eff}$ is the effective refractive index of the waveguide and $\Lambda$ is the spatial period of the grating fabricated in the laser waveguide for that laser. The Bragg wavelength spacing $\Delta\lambda$ between neighboring wavelengths within an array of DFB or DBR (distributed Bragg reflector) lasers is principally determined by the effective refractive index $n_{eff}$ and the designed increment $\Delta\Lambda$ in the grating period and is given by $$\Delta\lambda = \frac{2 n_{eff} \Delta\Lambda}{1+D} + \delta\lambda \quad (2)$$

where the parameter D is given by $$D = -\frac{\lambda}{n_{eff}} \cdot \frac{\partial n_{eff}}{\partial \lambda} \quad (3)$$

and represents the wavelength dispersion of the material and the waveguide. The parameter $\delta\lambda$ represents an error in wavelength spacing and is given by $$\delta\lambda = \frac{2 n_{eff} \delta\Lambda + \frac{\lambda}{n_{eff}} \cdot \frac{\partial n_{eff}}{\partial x} \delta x}{1+D}, \quad (4)$$

where $\delta\lambda$ is the fabricational error in defining the grating pitch (the digitizing error is ~0.004 nm in the e-beam writer used in the results reported below) and $\delta x$ represents the relative random fluctuations causing the effective refractive index $n_{eff}$ to vary among different lasers within the array from such causes as spatial variations in the waveguide width, composition, and thickness due to fabricational inconsistencies. These equations show that uniform wavelength spacing can be achieved only if the fabricational error $\delta\Lambda$ and the random fluctuations $\delta x$ are minimized. Zah et al. have estimated the magnitude of the wavelength variations for both gratings and waveguides in "Monolithic integrated multiwavelength laser arrays for WDM lightwave systems,"*Journal of Optoelectronics-Devices and Technologies*, vol. 9, pp. 153–166, 1994, but they assume that a buried heterostructure provides the lateral waveguide confinement.

There are two principal types of semiconductor waveguide structures used to provide both optical confinement in the vertical and lateral directions and, in the case of laser waveguides, electrical confinement in the lateral direction. The first type is a buried heterostructure waveguide generally illustrated in cross section in FIG. 2. A laterally defined core region 30 is formed within and below the surface of a semiconductor body 32, the core region 30 having a higher refractive index n than that of the surrounding body 32. If the buried heterostructure waveguide is a laser, the portion of the semiconductor body above the core region 30 has a semiconductivity type opposite to that of the portion below while the portions on the lateral sides of the core region 30 are made insulating so as to guide the biasing current through the active core region 30. The core region 30 supports an optical mode 34 that extends throughout the core region 30 and outwardly a small distance into the lower-index semiconductor body 32.

The second type of waveguide is a ridge waveguide illustrated in cross section in FIG. 3. A laterally undefined core layer 36 is formed over a semiconductor substrate 38 of lower refractive index. Thereby, the substrate 38 acts as a lower cladding layer. An upper cladding structure 40, also of lower refractive index, is formed over the core layer 36 and includes a thin planar etch stop layer 42 and a thicker ridge 44. The planar etch stop layer 42 is made, for example, of a thin GaInAsP quaternary layer with a 1.05 $\mu$m-bandgap layer on top of a thin InP layer. The thickness of the etch stop layer 42 and the dimensions of the ridge 44 are chosen such that the core layer 36 can support an optical mode 46 only in the vicinity of the ridge 44. For a laser waveguide, electrical contact is made to the top of the ridge 44, which guides the biasing current to the portion of the active core layer 36 underneath the ridge 44.

In either case, some fluctuations in the width of the waveguide are expected because the width, which depends on the lateral extent of the core region 30 of FIG. 2 or of the ridge 44 of FIG. 3, is defined by a photolithographic process involving chemical etching.

A principal difference between these structures affecting the magnitude of the wavelength variational effects of DFB (distributed feedback) lasers is the lateral index contrast which is defined as the difference in the refractive index between the waveguide core and its surrounding material. For an active waveguide such as a laser, a buried heterostructure waveguide exhibits a high value of lateral index contrast (~0.08–0.09) while a ridge waveguide exhibits a relatively low value (~0.01–0.02). The values of effective refractive index are plotted in FIG. 4 as a function of waveguide width for the InGaAsP semiconductor material system used by Zah et al. in optical systems operating at 1.55 $\mu$m. Curve 48 gives the effective refractive index for the zero-order mode in a ridge waveguide, and curve 50 gives the equivalent value in a buried heterostructure waveguide. Either waveguide is designed to support only the zero-order transverse mode. In particular, the width of the ridge waveguide is usually chosen to be near 3$\mu$m and that of the buried heterostructure waveguide to be near 1.5 $\mu$m in order to obtain a single optical mode. It is seen that the ridge waveguide has a refractive index that is much less sensitive to fluctuations in waveguide width.

Calculations show that width fluctuations produce 5 to 10 times greater variation in effective refractive index in a buried heterostructure waveguide than in a ridge waveguide. Furthermore, the width control of the active buried heterostructure waveguide is more difficult since it is usually determined by non-selective diffusion-limited etching to achieve the required undercut of the waveguide. Thus, the ridge waveguide structure is a better choice for building a multi-wavelength DFB laser array because of its higher tolerance to fabricational variations. However, there are other considerations in choosing between ridge and buried heterostructure waveguides.

Figure 5:
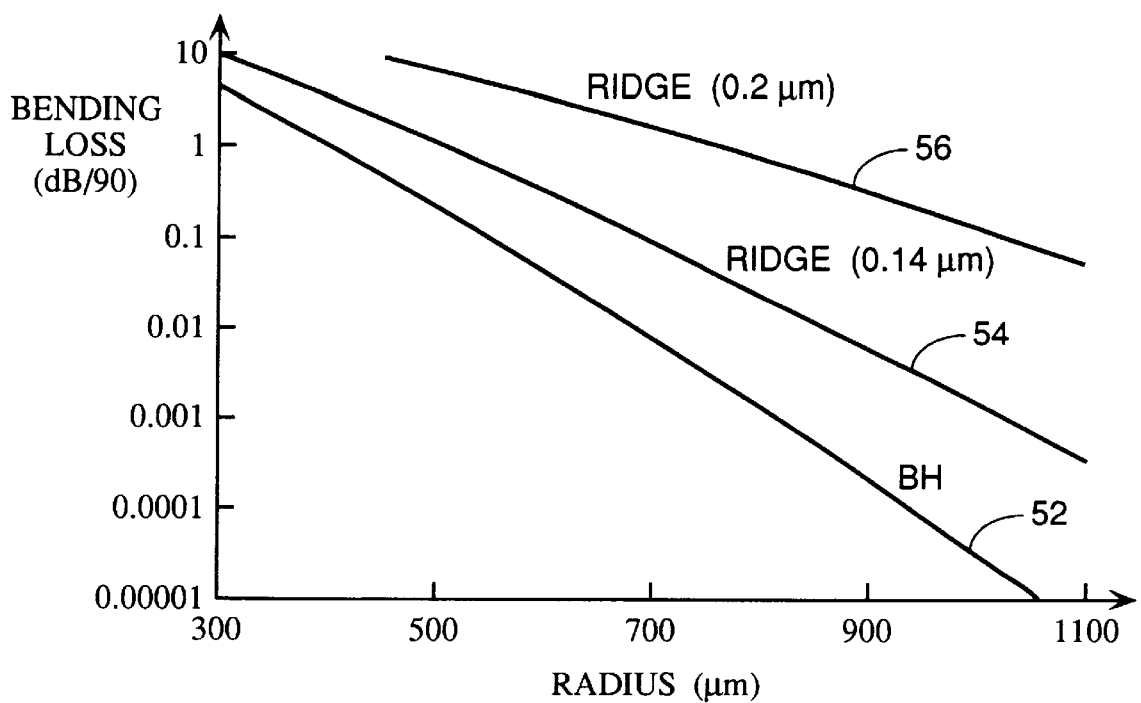
FIG. 5 is a graph of bending losses as a function of bend radius for both ridge and buried heterostructure waveguides.

The passive waveguides 14, 18 on the transmitter chip 10 of FIG. 1 must undergo tight bends if the size of the chip 10 is to be kept reasonably small. However, tight bends tend to cause high radiation loss. Bending loss has been calculated as a function of the bend radius for three passive waveguide structures, each having a width of 3 $\mu$m, in which the core region or layer is composed of a 0.2-$\mu$m thick InGaAsP layer with a bandgap wavelength of 1.25 $\mu$m, and the upper and lower claddings, including the ridge, are primarily composed of InP, which is semi-insulating in the case of the upper cladding of passive waveguides. Trace 52 of FIG. 5 shows the results for a buried heterostructure waveguide, trace 54 for a ridge waveguide with a thickness of the thin planar cladding layer 42 on the sides of the ridge being 0.14 $\mu$m, and trace 56 for a ridge waveguide with the corresponding thickness being 0.20 $\mu$m. The bending loss is higher for the ridge waveguide, but also importantly the bending loss is a strong function of the thickness of the thin planar cladding layer. A change of 0.06 $\mu$m increases the bending loss by 10 dB or more.

For buried heterostructure waveguides, thickness is not a major consideration. The thickness of the core region is dependent upon the epitaxial growth technique, which is tightly controlled, and there is no significant etch dependence for the buried heterostructure. On the other hand, ridge waveguides are very sensitive to etching depth since the optical modes are largely determined by the thickness of the upper cladding structure 40, which results from a deep etch producing the ridge 44. For a non-selective dry (plasma) etch that is typically used for etching waveguides, it is very difficult to control the depth of the etch. If wet etching is used, selective etchants are available which will stop on etch stop layers of a given composition. For example, referring back to FIG. 3, the upper cladding structure 40 includes the quaternary GaInAsP etch stop layer 42 with a bandgap wavelength of 1.05 $\mu$m, and an InP selective etchant would etch the unmasked overlying InP until it reaches the underlying etch stop layer 42. Nonetheless, even though etch stopping accurately controls etch depth, the etch profile for the ridge tends to vary in an unreliable fashion with the orientation of the ridge. If the ridge extends along the <0,1,1> crystallographic direction, the ridge tends to be rectangular; but, if it extends along <0,1,-1>, it tends to be somewhat trapezoidal. The exact demarcation between these two regions is uncertain so that different chips exhibit different shapes of their ridge waveguides and thus different waveguide loss. Additional loss occurs at the transition between the two profiles. We have measured a 3 dB excess loss for ridge waveguides formed by selective wet etching into double S-bends.

Because ridge waveguides experience bending loss and variation in the loss, buried heterostructure waveguides, which are not so impaired, are preferred for passive waveguides in a complex opto-electronic integrated circuit. Hence, the optimal OEIC design would use ridge waveguides for the active waveguides, such as lasers and optical amplifiers, but would instead use buried heterostructure waveguides for the passive waveguides. The invention incorporates both types of waveguides on an integrated circuit chip and provides a low-loss transition between them. Active waveguides, such as laser diodes, amplifiers, modulators, and directional couplers can be implemented as ridge waveguides while passive components, such as transmission waveguides whether straight or bent, star couplers, power splitters, and arrayed waveguide multiplexers and demultiplexers, can be implemented as a buried heterostructure.

Figure 6:
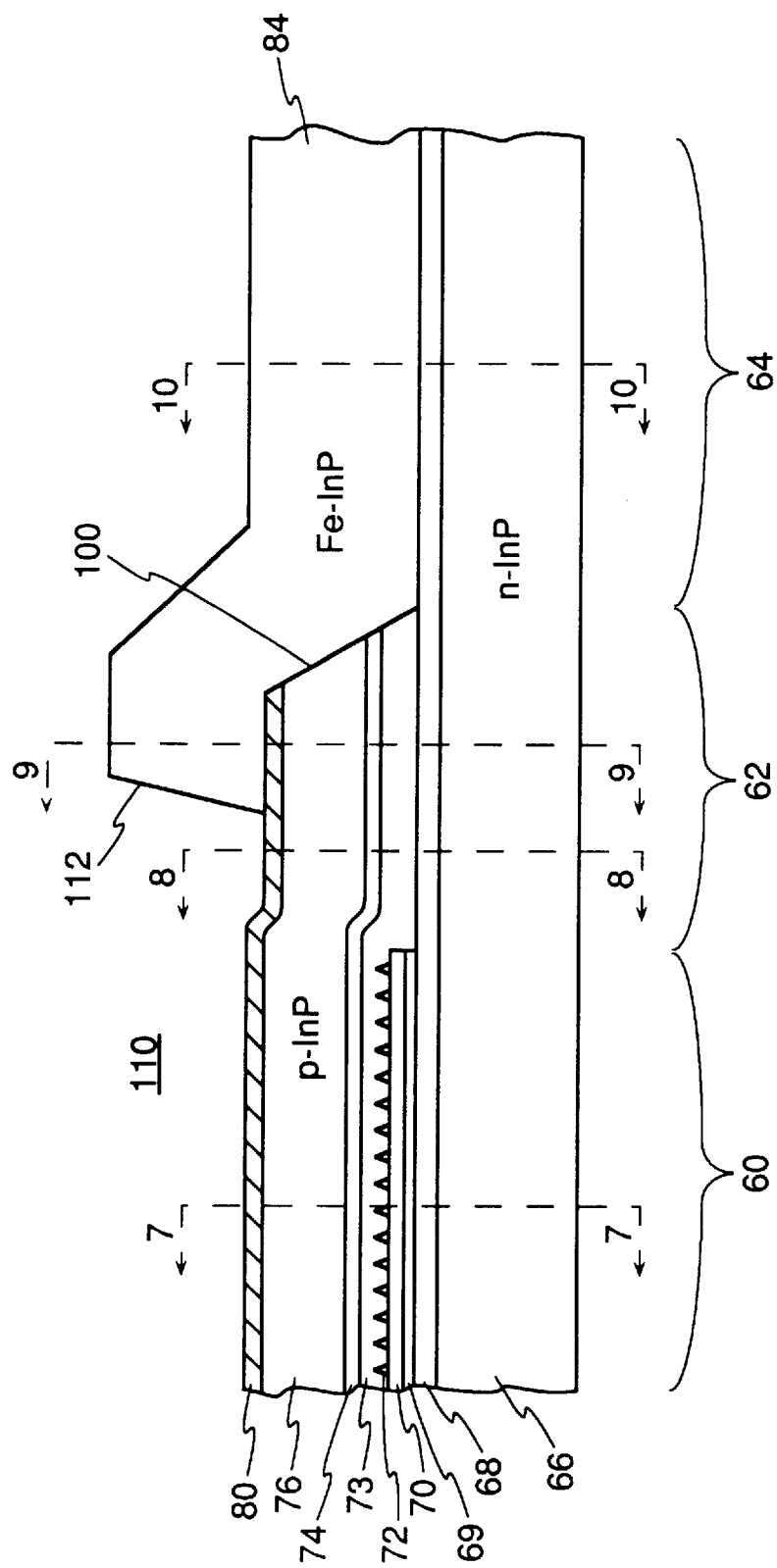
FIG. 6 is a longitudinal cross section of a first embodiment of the invention.

A longitudinal cross section along the optical axis of a first exemplary structure of the invention is shown in FIG. 6, and transverse cross sections of the structure are shown at various points along the optical axis are shown in FIGS. 7, 8, 9, and 10. The structure is divided into an active ridge waveguide region 60, a transition region 62, and a passive buried heterostructure waveguide region 64. The structure is epitaxially formed on an n-type InP substrate 66 and includes a passive waveguide layer 68. More precise descriptions of thicknesses and compositions will be delayed until the fabricational process is described. The passive waveguide layer 68 in this embodiment extends along the entire structure, is primarily used for the core region of the buried heterostructure, but is n-type because it is in the conduction path for the active ridge laser.

Figure 7:
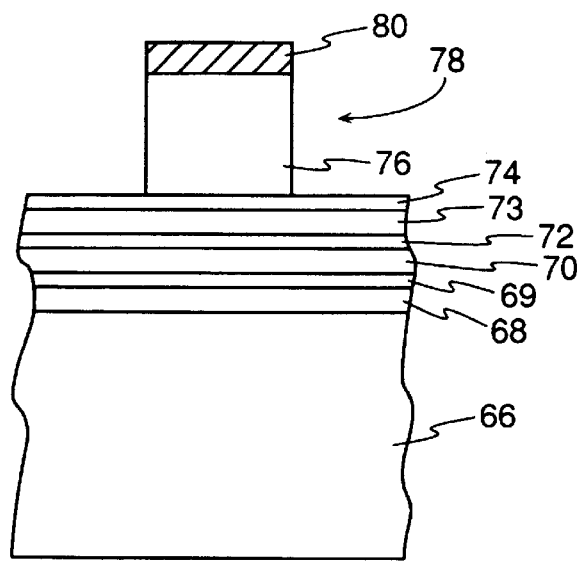
FIGS. 7, 8, 9, and 10 are transverse cross sections of the first embodiment taken along respective sectional lines 7—7, 8—8, 9—9, and 10—10 of FIG. 6.

In the active ridge region 60 of FIGS. 6 and 7, a thin etch stop layer 69 and an active layer 70 of, for example, multiple quantum wells, are formed over the laterally undefined passive waveguide layer 68, and a grating layer 72 is formed over the active layer 70. The passive waveguide layer 68 and the active layer 70 in combination have higher refractive indices than the surrounding layers so that they can support a confined optical mode. In InGaAsP, the refractive index decreases monotonically with increasing bandgap so that the refractive index of the active layer 70 will be higher than the index of the transparent, i.e. high-bandgap, waveguide layer 68. The grating layer 72 is formed as a corrugated grating with the desired pitch to cause the active region to lase at a particular frequency. A thin p-type upper planar cladding layer 73 together with a thin etch stop layer 74 are formed over the active layer 70 and its gratings 72 and over the passive waveguide layer 68 in the transition region 62. An overlying p-type upper cladding layer 76 is formed into a ridge 78 with an overlying contact layer 80. This forms an active ridge waveguide that is electrically biased between the contact layer 80 and the substrate 66 with the layers below the active layer 70 being n-type and those above being p-type.

Figure 10:
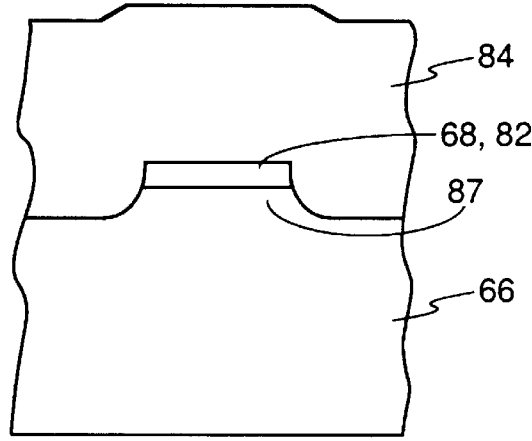

In the passive, buried heterostructure region 64 of FIGS. 6 and 10, the passive waveguide layer 68 is laterally defined into a core stripe 82 and is overlaid with a thick semi-insulating upper cladding layer 84. The process for forming it will be described below.

The transition region 62 includes two different sub-structures. The first sub-structure is formed in a passive ridge region shown in FIG. 8. The ridge 78 continues from the active ridge region 60, but the active layer 70 does not extend into the passive ridge region. This first sub-structure thus acts as a passive ridge waveguide and guides light coupled to or from the active ridge region 60. With the exception of the active layer 70 and its grating 72, the structure is continuous with the active ridge region 60. The second sub-structure is formed in a passive slab region shown in FIG. 9. Only a very shallow mesa 86 is formed in the first upper cladding layer 76 and it is surrounded by an insulating second upper cladding layer 84. In the absence of a ridge surrounded by a region of substantially lower refractive index, there is no horizontal waveguiding. Further, the passive waveguide layer 68 is not locally defined laterally, as it would be a buried heterostructure. Therefore, the second sub-structure confines light vertically but does not confine it laterally. Hence light coupled into the passive slab waveguide from the passive ridge waveguide tends to spread laterally before it is coupled into the laterally confining buried heterostructure waveguide.

Figure 11:
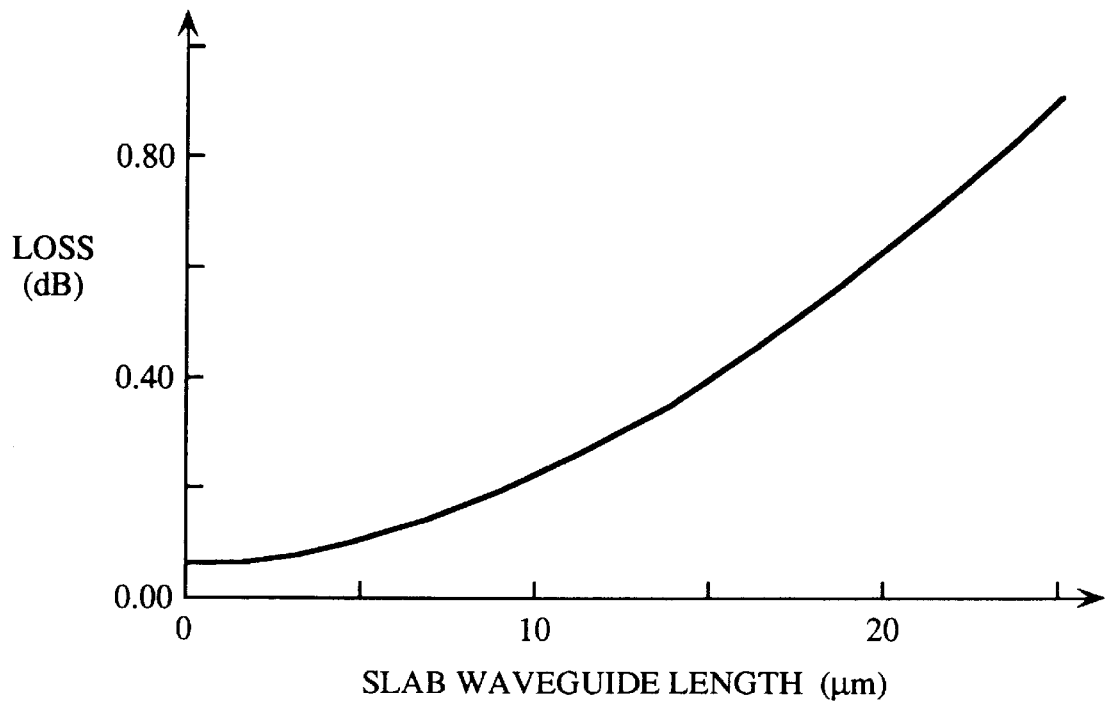
FIG. 11 is a graph of the calculated transition loss as a function of the length of the slab waveguide.

The slab waveguide region provides the transition between the ridge waveguide and the buried heterostructure waveguide. Its length should be minimized consistent with fabricational constraints. Optical propagation between the ridge and buried heterostructure waveguides was modeled by the beam propagation method, and the coupling loss as a function of the length of the slab waveguide is shown in FIG. 11. A zero length for the transition slab waveguide, which fabricational constraints preclude, produces a transition loss of about 0.05 dB because of the modal mismatch between the ridge and buried heterostructure waveguides. For a transition length of less than 10 $\mu$m, the transition loss is 0.2 dB or less. It is believed that existing fabricational tolerances can accommodate a transition length of 7.5 $\mu$m.

These transition losses are calculated on the assumption that the two waveguides are perfectly aligned laterally. Such alignment can be substantially achieved by a self-aligned process described below with reference to the process diagram of FIG. 12. A structure was fabricated according to the process. A scanning electron micrograph showed the two types of waveguides to be aligned, and the transition loss was measured to be a negligible value. The process described below includes particular values of thicknesses and compositions that correspond to the experimental structure, but the invention is not limited to these values.

In step 90, low-pressure organo-metallic chemical vapor deposition (OMCVD) is used to epitaxially deposit the lower and middle parts of the waveguide structure. The passive waveguide layer 68 is deposited on the n-type InP substrate 66. It has a InGaAsP quaternary composition lattice matched to InP and with a composition producing a bandgap wavelength of 1.25 $\mu$m. It is doped n-type and grown to a thickness of 0.2 $\mu$m. Over the passive waveguide layer 68 is deposited the thin etch stop layer 69 of n-type InP having a thickness of 40nm. Over etch stop layer 69 is deposited the active layer 70, which is a multiple quantum-well structure having an undoped quaternary composition producing a bandgap wavelength of 1.56 to 1.57 $\mu$m. The quantum wells may be strained or unstrained. The grating layer 72 is deposited over the active layer with a quaternary InGaAsP composition having a bandgap wavelength of 1.25 $\mu$m.

At this point, the structure is horizontally undefined. However, in step 92, the laser grating is photolithographically defined on the grating layer 72 in the region of the ridge waveguide lasers. In this etching step, the grating layer is corrugated by plasma etching with $CH_4/H_2$. An electron beam writes the grating pattern into a resist, and the irradiated portions of the resist are stripped. The portion of the grating layer 72 that is thereby exposed is non-selectively etched to a depth of 30 to 40 nm to form the grating.

In step 94, the grating layer 72, the active layer 70, and the underlying etch stop layer 69 are removed in regions longitudinally outside the active ridge waveguide region 60. This structural definition, however, does not include the lateral definition of the ridge 78. The removal is performed photolithographically with a photomask patterned to cover the active ridge waveguide region 60 including an optically long lateral region. Two selective etchants respectively attack the quaternary active layer 70 with a quaternary selective etchant, e.g., $3H_2SO_4:1H_2O_2:1H_2O$ (by volume) which stops on the InP etch stop layer 69, and then attacks the InP thin etch stop layer 69 with an InP selective etchant, e.g., $3H_3PO_4:1HCl$ (by volume) so as to stop on the underlying quaternary passive waveguide layer 68.

After the etching of step 94, the photoresist is removed, and in step 96 the upper cladding layers are epitaxially regrown over the partially patterned active layer 70 and passive waveguide layer 68. The bottom layer is the thin p-type InP cladding layer 73 having a thickness of 100 to 140 nm, over which is deposited the p-type quaternary etch stop layer 74 have a thickness of 30 nm and a composition producing a bandgap wavelength of 1.05 μm. The upper, p-type InP cladding layer 76 is deposited over the quaternary etch stop layer 74 to a thickness, for example, of 1.8 μm, and over it is deposited the highly p-type contact layer 80 of, for example, $In_{54}Ga_{0.46}As$ having a thickness of 0.3 μm.

In step 98, the upper cladding layers 73, 74, 76, 80 are removed in areas over and laterally adjacent to the passive, buried heterostructure 64. Similarly to step 94, a photoresist is patterned, and a two-step selective etch stops on the underlying passive waveguide layer 68. The etchants produce a sloping surface 100 having a <111> A crystallographic orientation at the heterostructure side of the transition region 62 when the principal optical axis extends along the <011> direction. Once again, the waveguides are not laterally defined in the etching of step 98.

In step 102, a self-aligned photolithographic step defines both the ridge waveguide and the buried heterostructure waveguide. The prior photoresist mask is removed, and a new continuous stripe photomask is defined over the areas of both waveguides. It extends along the optical axis through the active ridge waveguide region 60, the transition region 62 and the passive buried heterostructure region 64, and it has a width corresponding to those of the final waveguides, for example, 3 μm. Since there is no well defined lateral waveguiding structure in the slab waveguide region, it is possible to change the width of the photoresist stripe in this region. Reactive ion etching is used to etch through the exposed portions of the ternary contact layer 80 and the quaternary passive waveguide layer 68. This etch produces the short-mesa structures 86, 87 shown in FIGS. 9 and 10 and produces similar short mesas in the areas of FIGS. 7 and 8, which are the beginnings of the ridge 78.

In step 104, the etching of the ridge 78 is completed. A mask is patterned to cover the passive waveguide region 64 and the slab waveguide portion of the transition region 62, the exact extent of the mask determining the change from the passive ridge waveguide and the slab waveguide. A selective etchant is applied to the exposed InP upper cladding layer 76, and it etches down to the quaternary etch stop layer 74, completing the structure of the ridge 78 shown in FIGS. 7 and 8. The ridge waveguide is defined by the ternary striped contact layer 80 that is self-aligned with the buried waveguide core 82 in the buried heterostructure waveguide.

In step 106, an insulating upper cladding is formed over the buried heterostructure region 64 and the slab waveguide region. First, over the whole wafer an unpatterned regrowth is performed of a thick upper cladding layer 84 of undoped or Fe-doped insulating InP, which may have a thickness of 3.5 μm, and then an unillustrated quaternary etch stop layer, for example, a 0.1 μm-thick layer of InGaAsP having a bandgap wavelength of 1.3 μm.

In step 108, these layers are then photolithographically defined to open a window well 110, shown in FIG. 6, over and laterally surrounding the active and passive ridge waveguides. Only with the removal of the InP in the window well 110 is the ridge 84 exposed with a high contrast of refractive index to its sides. A selective etchant is applied through a well photoresist mask to etch the InP layer 84 down to either the ternary contact layer 80 or the underlying quaternary etch stop layer 74.

Figure 8:
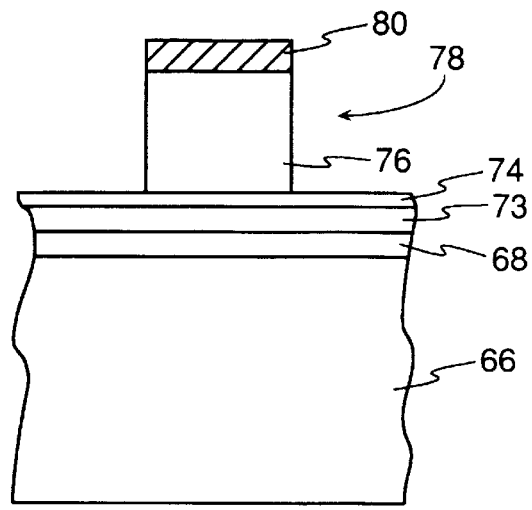

This completes the formation of the ridge 78 in the active ridge waveguide region 60 and in the passive ridge waveguide region of FIG. 8. The window well 110 that was opened needs to extend optically far from the sides of the ridge. Its edge 112 next to the slab waveguide creating the edge of the upper cladding layer 84 is non-critical to within a few micrometers since it defines the transition from the passive ridge waveguide to the slab waveguide.

The input and output sides of optical waveguide structures are referred to as facets. As shown in FIG. 1, two principal facets are the head-end facets 114 and output facets 116 at the ends of the optical waveguides that abut the edges 117 of the opto-electronic integrated circuit chip adjacent to the active waveguides 12, 20. Each head-end facet 114 is not intended to convey light, but its structure and close separation between the chip end and the laser diode 12 requires some consideration of its waveguiding. The light reflected from these chip facets 114, 116 and associated chip faces present potential problems in the adjacent active areas. The reflectivity of the front facet 116 of a semiconductor optical amplifier 20 needs to be low to avoid the back reflection of light causing ripple in the gain or unwanted oscillation. The reflectivity of the rear facet 114 of the laser diodes 12 needs to also be low to avoid the back reflected light from pulling the lasing wavelength away from the Bragg wavelength.

A window facet is a type of facet that has been optimized for minimum reflectivity rather than for other characteristics such as transition loss. A window facet is commonly incorporated into the facet end of the active waveguide to reduce the back reflection. For example, the active waveguide is terminated 50 to 60 μm before the chip facet to allow the beam to expand such as to reduce the amount of light reflected back to the active waveguide by a factor related to the overlap of the reflected beam to the eigenmode of the active waveguide. Further, a single layer of anti-reflection coating is often applied to the chip facet to additionally reduce the facet reflectivity.

Several parties have reported a window facet integrated with a buried heterostructure waveguide. See, for example, the articles: (1) Utaka et al., "Effect of Mirror Facets on Lasing Characteristics of Distributed Feedback InGaAsP/InP Laser Diodes at 1.5 μm Range," *IEEE Journal of Quantum Electronics,* vol. QE-20, 1984, pp. 236–245; (2) Cha et al., "1.5 μm band travelling-wave semiconductor optical amplifiers with window facet structure,"*Electronics Letters,* vol. 25, 1989,pp. 242, 243; and (3) Olsson et al., "Polarisation-independent optical amplifier with buried facets," *Electronics Letters,* vol. 25, 1989,pp. 1048, 1049. However, the integration of window facets with ridge waveguides is believed to be novel.

Figure 12:
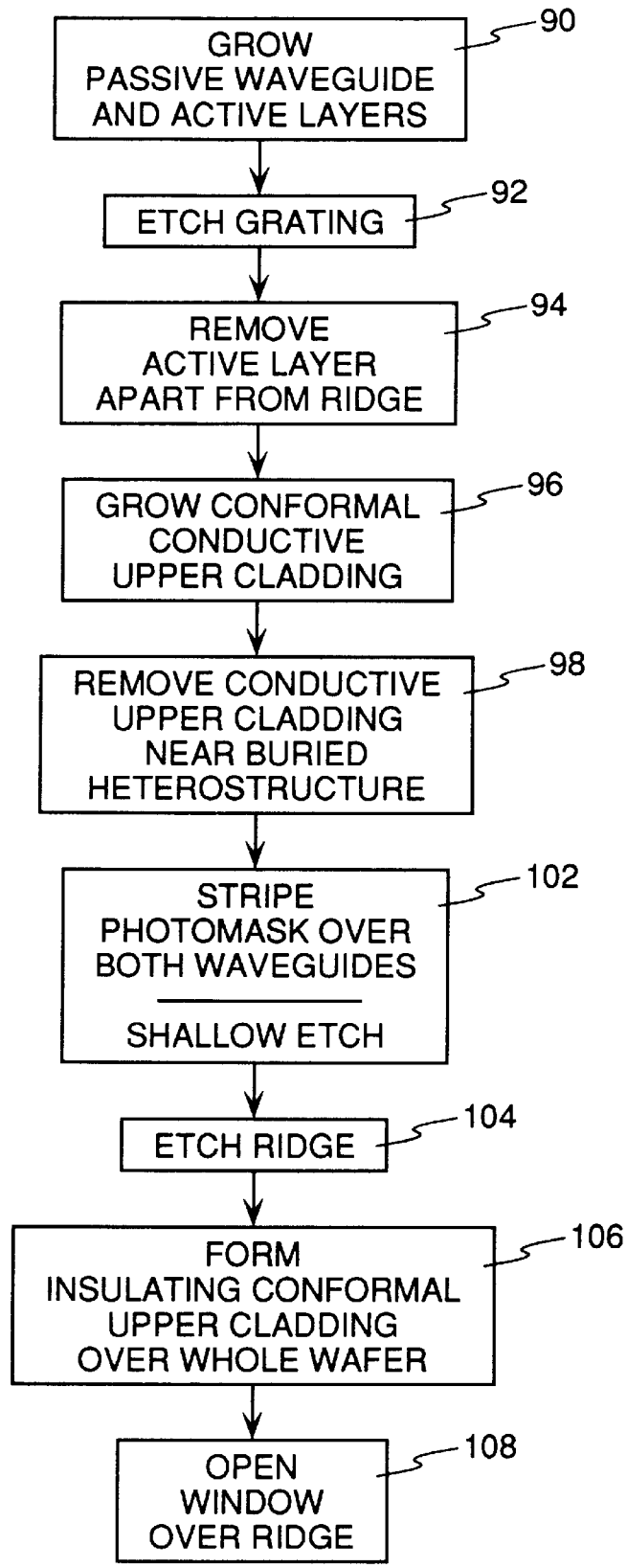
FIG. 12 is a process diagram for the self-aligned process of forming the ridge and buried heterostructure waveguides together with the intermediate transition region.

The process of FIG. 12 can be somewhat modified in the masking and etching steps to produce a window facet at one end of an active ridge waveguide. Two different such structures are shown in longitudinal cross sections in FIGS. 13 and 14.

It should be mentioned now that the optical amplifiers 20 at the outputs of the OEIC chip 10 of FIG. 1 have an input end similar to the structure of FIGS. 6 through 10 but reversely oriented in the respect that the buried heterostructure region 64 carries the incoming light which is coupled through the transition region 62 to the active ridge waveguide region 60, now acting as an optical amplifier. The grating layer 72 is not defined into a Bragg grating in the amplifiers 20, but it could be. The output ends of the amplifiers 20 include the window facet to now be described.

Figure 13:
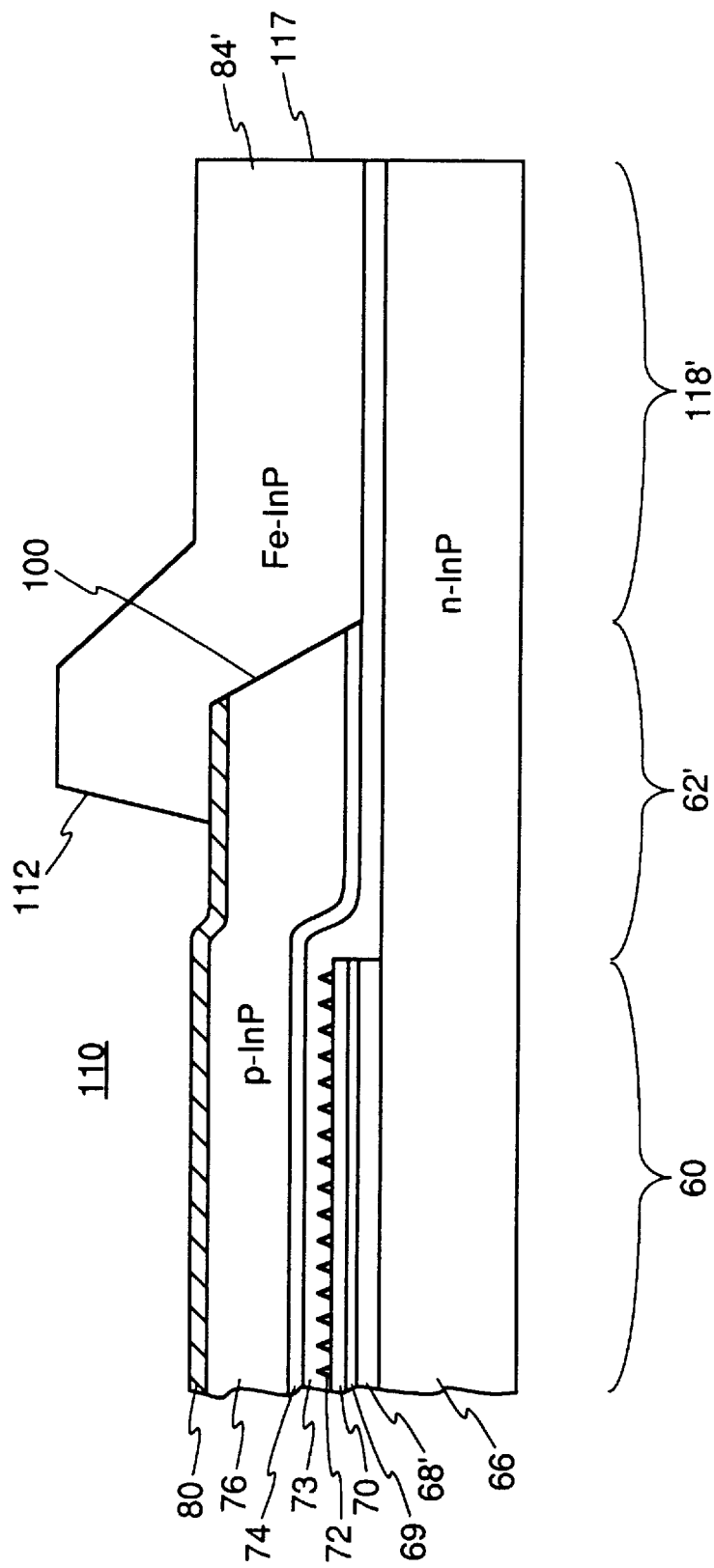
FIG. 13 is a longitudinal cross section of a first embodiment of a window facet at the end of an ridge waveguide.
Figure 14:
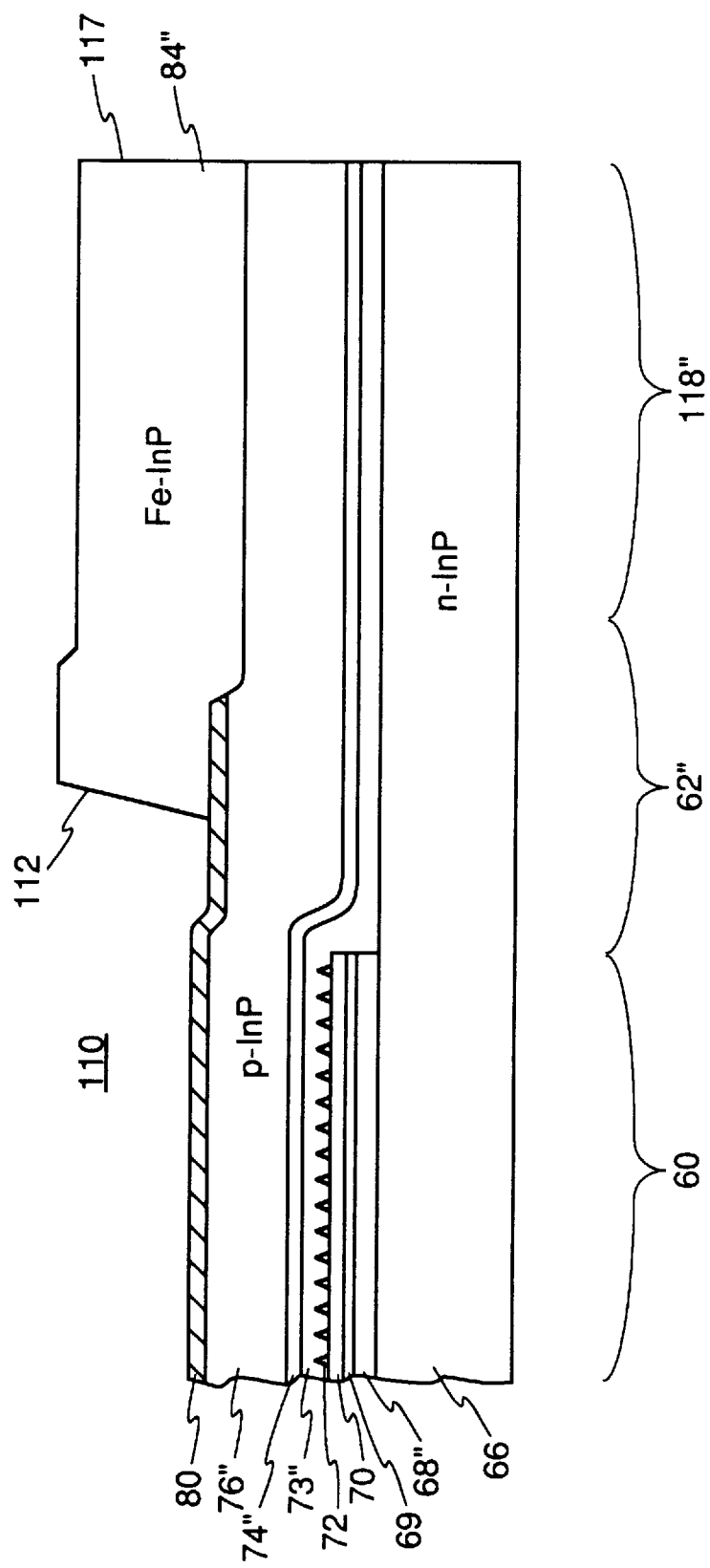
FIG. 14 is a longitudinal cross section of a second embodiment of a window facet at the end of an ridge waveguide.

In both embodiments of the window facet, as illustrated in both FIGS. 13 and 14, a passive waveguide layer 68', 68" extends only to the end of the active ridge waveguide region 60 and does not extend through the transition region 62', 62Δ or a window facet region 118', 118". It is to be appreciated however that the transition region 62', 62" also acts as part of a window facet region. As a result, the passive waveguide layer 68', 68" is terminated before the window and provides no substantial vertical confinement in the transition region 62', 62" or the window facet region 118, 118', and the light diverges in the vertical direction in the passive ridge waveguide region. The light starts to diverge horizontally in the transition region 62', 62" and in the window facet region 118', 118" after the ridge region. Since the transition region is relatively short (~15 $\mu$m), the expansion of light is small enough that the overlying residual contact layer 80 will not affect the light divergence, and the light will mainly expand in the window facet region 118 ', 118".

The window facet regions 118', 118" can each be formed without the presence of the passive waveguide layer beneath either the transition region 62', 62" or the window facet region 118 ', 118" by adding after step 94 of the process of FIG. 12 a photolithographic step that removes the passive waveguide layer 68', 68" from the transition region 62', 62" and the window facet regions 118 ', 118". This can be accomplished by using a three-step selective etching to finally remove the quaternary passive waveguide layer 68', 68".

The window facet region 118' of FIG. 13 includes a homogeneous structure and its upper cladding 84' includes only semi-insulating Fe-InP. However, if this window facet region 118' is to be integrated with the waveguide structure of FIG. 6, an additional step of masking and selective etching is inserted after step 98 in FIG. 12. This additional step etches away the p-type cladding layer 76" and the thin etch stop layer 74 in all of the window facet region 118' but does not remove the thin InP layer 73 or any of the InP substrate 66, which is acting as the lower cladding.

In the embodiment of FIG. 13, the window facet region 118' has a very simple structure of the semi-insulating upper cladding layer 84' overlying the n-type substrate 66 with no lateral definition of either. The passive upper cladding layer 84' has a medium thickness comparable to that of FIG. 6 and has a medium allowable length so as to avoid light from hitting the top surface.

Figure 9:
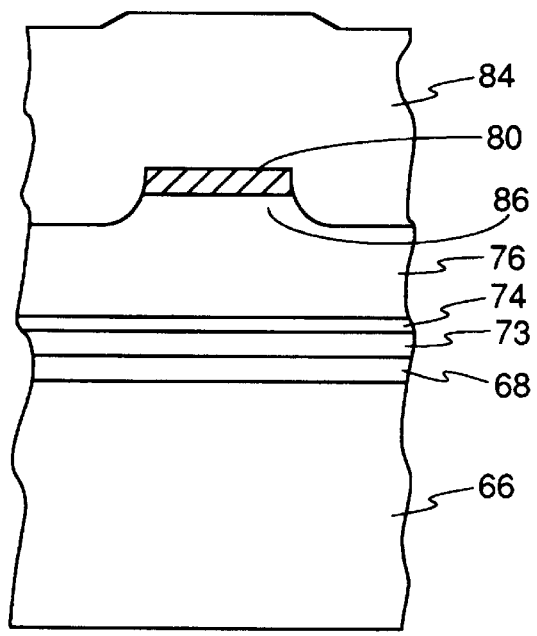

The structure of FIG. 14 can be achieved without additional steps. Instead, the stripe photomask of step 102 is defined to expose all of the window facet region 118', that is, not defining the buried heterostructure in a window facet region 118'. As a result, when the short mesa 86 of FIG. 9 is etched in step 102, the p-type cladding layer 76" in the window facet region 118" is etched only slightly. In the subsequent ridge etching step 104, the window facet region 118" is protected, and when the semi-insulating layer 84" is deposited, it forms over the remaining portion of the p-type cladding layer 76" in the window facet region 118".

A resulting total upper cladding in FIG. 14 is relatively thick because it includes both an active upper cladding layer 76" and a passive upper cladding layer 84". As a result, the window's length can be relatively long without the beam hitting the top surface. The thin etch stop layer 74‖ remains in this process. The resulting structure in the facet window region 118" is not laterally defined but includes the semi-insulating upper cladding layer 84", the p-type thin cladding layer 76", the etch stop layer 74, the p-type planar upper cladding layer 73", and the n-type substrate 66.

We have tested the structure associated with FIG. 14 with the integrated array of multi-wavelength lasers. Including a single layer of anti-reflection coating, the residual facet reflectivity is estimated to be $10_{-4}$, and the coupling loss is estimated to be about 5 to 7dB, partially due to the far-field distortion resulting from the thin etch stop layer. Nonetheless, the window structure of FIG. 13 has the potential to achieve both low facet reflectivity and low coupling loss if a thick semi-insulating InP layer 84' is grown on top of the window facet region 118'. However, one more masking and etching step is required.

Figure 15:
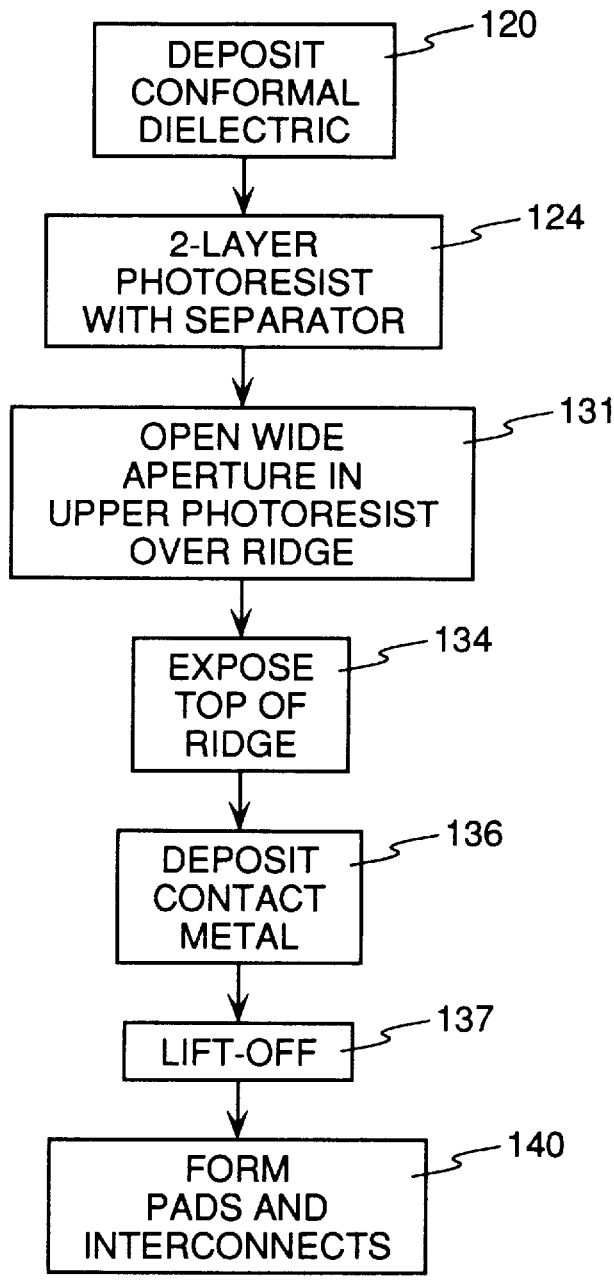
FIG. 15 is a process flow diagram for forming the electrical contact to the top of the ridge.

After the completion of step 108 of FIG. 12, further processing is required to contact metalization on both sides of the wafers in order to inject biasing current to each individual laser or semiconductor optical amplifier. Because the top ridge is only 3 $\mu$m wide, contact to it is more critical. However, we have achieved a good ohmic contact to the 3 $\mu$m ridge using the self-aligned process, described in the process diagram of FIG. 15 with reference to associated cross-sectional views.

Figure 16:
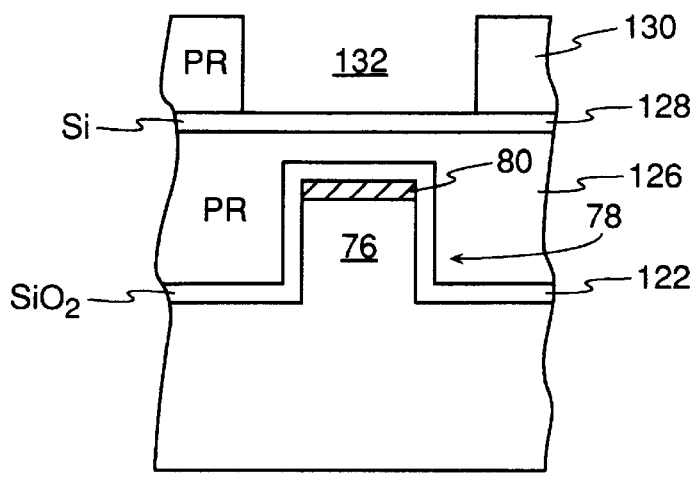
FIGS. 16, 17, and 18 are cross sectional views of the electrical contact structure at the ridge during several phases of its formation by the process of FIG. 15.

In step 120, a conformal dielectric layer 122 is deposited over the ridge 78, as shown in FIG. 16. For example, the dielectric layer may be 300 to 400 nm of $SiO_2$. In step 124, deposit a dual-layer photoresist with a thin intermediate layer separating the photoresist. A lower photoresist layer 126 is spun on to planarize its upper surface above the ridge 78. A thin intermediate layer 128 is deposited of a material that is not attacked by the photoresist developer, e.g., Ge or Si. An upper photoresist layer 130 is spun on over the intermediate layer 128 so as to be planarized and to be separated from the lower photoresist layer 126 by the intermediate layer 128. The intermediate layer 128 prevents the lower photoresist 126 being removed while the upper photoresist is being developed and provides a reference level, accurately defined by the epitaxial growth process, that is much closer to the top of the ridge 78.

In step 131, an opening 132 is photographically developed in the portion of the upper photoresist layer 130 that overlies the ridge 78 and has a width substantially larger than the ridge width, e.g., 8 $\mu$m, such that the ridge 78 can be easily aligned within the opening 132.

Figures 17, 18:
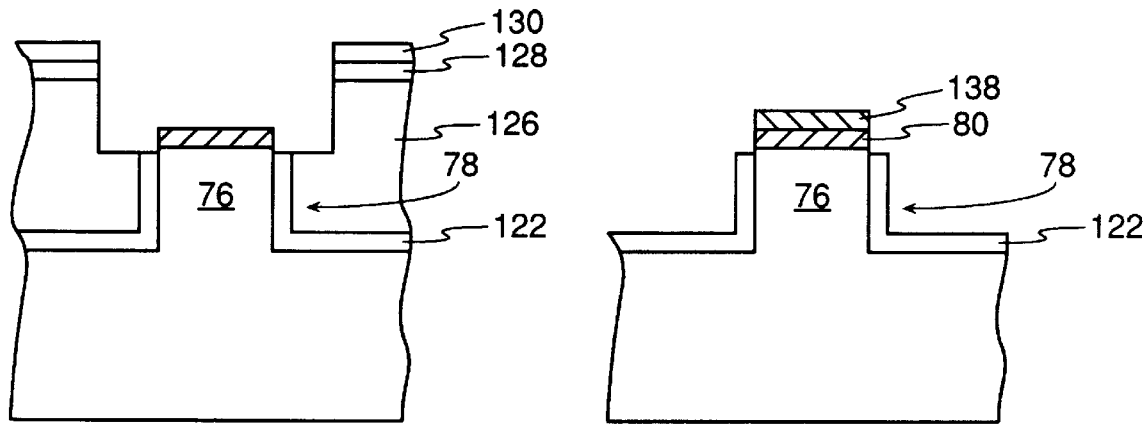

In step 134, the intermediate layer 128 exposed at the bottom of the opening 132 is etched away by reactive ion etching, for example, with $CF_4$. Then, the photoresist layers 126, 130 are uniformly etched to an extent that the bottom photoresist layer 126 exposes the dielectric layer 122 at the top of the ridge 78, and the exposed dielectric layer 122 is thereafter removed by reactive ion etching, for example, with $C_2F_6$, to expose the contact layer 80 at the top of the ridge 78, as shown in the cross section of FIG. 17, but the second photoresist etch leaves portions of the lower photoresist layer 126 surrounding the lower portions of the ridge 78.

In step 136, a p-contact metal, such as Ti/Au, is evaporated or otherwise deposited over both the contact 80 at the top of the ridge 78 and over the photoresist 126, 130. In step 137, both the photoresist layers are dissolved so as to lift off the contact metal deposits away from the ridge as well as any remaining intermediate layer 128, so as to produce the structure shown in FIG. 18, a metal contact 138 extending completely over the semiconductor contact 80 at the top of the ridge 78. The wide metal contact 138 reduces the series resistance.

In step 140, standard metallization techniques are used to deposit another metallization layer and pattern it into the larger and less critical interconnections and bonding pads connected to the metal contacts 138 forming the p-contact of the active diode structure. The dielectric layer 122 provides satisfactory electrical insulation between the interconnect metallization and the underlying semiconductor structure. Also, an n-contact metallization is applied to the n-type substrate, whether from the top or bottom.

This structure and the process used to form the structure provide the following advantages. The lasing wavelength of the DFB laser array can be accurately controlled within a ridge waveguide diode laser. Nonetheless, the passive waveguide components can be simultaneously implemented as buried waveguide structures that are predictable, reproducible, and compact and exhibit low loss, especially when formed into bends. Importantly, the self-aligned fabrication process produces a transition between the ridge waveguide and the buried heterostructure waveguide that suffers negligible loss.

The semi-insulating InP upper cladding layer, whether undoped or Fe-doped, formed over the buried heterostructure waveguide produces a SIPBH (semi-insulating planar buried heterostructure) waveguide with low optical propagation loss. The relatively thick semi-insulating upper cladding layers reduces the parasitic capacitance of pads and interconnects placed on top of it. The low parasitic capacitance per unit area allowed a prototype chip having relatively long interconnection lengths required by the electrical fan-out to nonetheless have DFB lasers each tested to have a modulation bandwidth of greater than 5 GHz. The semi-insulating InP upper cladding layer also provided high electrical isolation of greater than 2000Ω between lasers or between a laser and the optical amplifier.

The window facet structures useful for low facet reflectivity can be integrated with the rest of the waveguide structure.

The regrowth is performed without surrounding masks so as to avoid anomalous regrowth around the mask edges. The ridge height is accurately controlled using selective etching and an etch stop layer.

The top metal contact is formed to be self-aligned to the entire top of the ridge to obtain low series resistance.

Zah et al. have described the overall optical integrated circuit in "InP-Based Multiwavelength Laser Arrays with Integrated Combiners for WDM Systems, *Proceedings: IEEE Lasers and Electro-Optics Society,* 1995 Annual Meeting, San Francisco, Calif., Oct. 30–Nov. 2, 1995, vol. 2, pp. 239, 240 and in "High Performance Multiwavelength Integrated DFB Laser Array," *Proceedings of Fifth Biennial DoD Photonics Conference,* McLean, Va., Mar. 26–28, 1996, pp. 167–170, and by Amersfoort et al. in "Wavelength Accuracy and Output Power of Multiwavelength DFB Laser Arrays with Integrated Star Couplers and Optical Amplifiers," Integrated Photonics Research, Apr. 29–May 2, 1996, Boston, Mass., 1996 *Technical Digest Series,* vol. 6, pp. 478–481.

Figure 19:
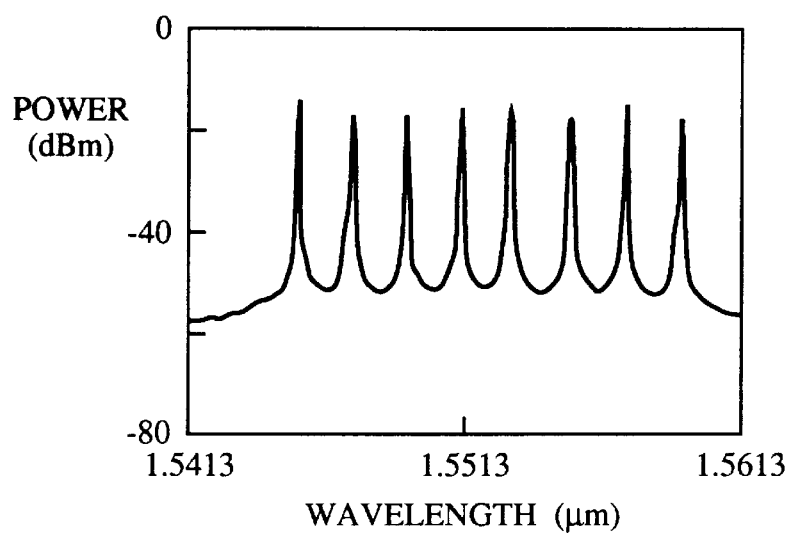
FIG. 19 is a graph of the optical output of a transmitter chip incorporating the invention into an array of 20 diode lasers generating 8 designated wavelengths.

Its planar layout is that shown in FIG. 1, its size being 4.3×1.4 mm². Its wavelength comb of eight wavelengths is arranged for 2 nm wavelength spacings around 1.55 μm, but two lasers and associated waveguides are included for each design wavelength as well as for wavelengths on the two sides of the design comb. The 20 lasers, arranged on 50 μm physical spacings and each being 370 μm long, provide redundancy for the 8 wavelength although only one laser per design wavelength is selected to be wire bonded and pigtailed. The redundancy allows wavelength deviations of less than ±0.2 nm from the design. The lasing thresholds have been limited to the neighborhood of 25 mA. The optical spectrum illustrated in FIG. 19, which combines the outputs of 8 lasers, shows the general measured performance.

Optical amplifiers of length 590 and 880 μm are incorporated in two of the four output waveguides to determine their effect. The optical amplifiers are intended to compensate for the 1/N power loss inherent in the star coupler. Window facets of the type shown in FIG. 14 are incorporated at the rear facet 114 of each DFB laser, as shown in FIG. 1, and at the facet 116 of each optical amplifier 20, with a 50 to 60 μm facet window intervening between the active element and the chip edge. A single layer of anti-reflection coating is applied to the output facet.

The passive waveguides are bent into S-curves with minimum radii of 600 μm to provide the physical laser spacing of 50 μm and the output spacings of 125 μm to facilitate pig-tailing to optical fibers. The outer input waveguides to the star coupler are flared to compensate for decreasing diffraction efficiencies.

The array has been tested for dynamical performance. Its modulation is limited to a 3 dB bandwidth of about 8 GHz. When operated to generate optical data signals at an OC-48 rate (2.488 Gb/s) a bit-error rate of $10^{-9}$ is observed.

It is thus seen that the waveguide structures provided by the invention allow the fabrication of a high-performance, low-cost multi-wavelength transmitter array, features essential to the successful commercialization of a multi-wavelength communication network.

Although the invention has been described with particular reference to the laser array of FIG. 1, the invention is not so limited and may be applied to other devices. The invention is not limited to the InP-based materials described above that are particularly useful for light at 1550 nm. Other wavelengths and material systems can be used.

As described above, the invention is particularly suited to an optical integrated circuit having an active ridge waveguide and a passive buried heterostructure waveguide in a complex transmitter chip. However, the structures and method of the invention can be applied to many other optical waveguide structures in other types of optical circuit boards. For example, the invention can be applied to an active buried heterostructure waveguide that needs to be optically coupled to a passive ridge waveguide. Concurrently active or concurrently passive structures are also possible.

What is claimed is:

1. An integrated waveguide structure, comprising:

a substrate comprising a semiconductor surface portion;

an optical ridge waveguide formed in said surface portion and including a laser comprising an active portion including an active layer and vertically arranged p-type and n-type cladding layers; and a passive buried heterostructure waveguide formed in said surface portion, having an upper insulating cladding layer, and being optically coupled to said ridge waveguide.

2. The integrated waveguide structure of claim 1, wherein said buried heterostructure waveguide includes a curved portion having a predetermined radius.

3. An integrated waveguide structure, comprising:

a substrate comprising a semiconductor surface portion;

an optical ridge wave\guide formed in said surface portion;

a buried heterostructure wave\guide formed in said surface portion and optically coupled to said ridge waveguide; and a transition extending longitudinally a predetermined distance between said ridge and buried heterostructure waveguides that does not substantially laterally confine light modes supported by said ridge and buried heterostructure waveguides and across which said optical ridge waveguide and said buried heterostructure waveguide are optically coupled.

4. The integrated waveguide structure of claim 3, wherein said transition includes an optical slab waveguide.

5. The integrated waveguide structure of claim 4, comprising a passive waveguide layer formed in said surface portion that is laterally defined within said buried heterostructure waveguide to form a core region in said buried heterostructure waveguide and is not defined in said slab waveguide for a substantial lateral distance.

6. The integrated waveguide structure of claim 5, wherein said passive waveguide layer additionally extends adjacent to said ridge waveguide.

7. A method of forming coupled ridge and buried heterostructure waveguide, comprising the steps of:
depositing over a substrate an optical core comprising at least one layer in a first region and in a second region of a substrate;
depositing a first upper cladding layer over said optical core in said first region;
depositing and patterning a continuous longitudinally extending mask over said first upper cladding layer in said first region and over said core in said second region;
etching around said mask form a ridge in said first region and to laterally define said optical core in said second region; and
depositing a second upper cladding region over said defined optical core in said second region.

8. The method of claim 7:
wherein said optical core includes a first layer extending through both said first and second region and an active layer extending only through said first region;
wherein said active layer extends over a surface portion of said substrate having a first conductivity type; and
wherein said first upper cladding layer has a second conductivity type.

9. The method of claim 8, wherein said second upper cladding layer is substantially insulating.

10. A window facet in an optical integrated circuit, comprising:
a semiconductor chip having an edge;
a ridge waveguide formed in said chip along an optical axis intersecting said edge and including a lower cladding layer, at least one core layer and at least one first upper cladding layer;
a transition region arranged along said optical axis between said ridge waveguide and said edge including in at least a longitudinal portion thereof said lower cladding layer, said upper cladding layer, but not said core layer; and
a window region disposed along said optical axis between said transition region and said edge and including said lower cladding layer and an additional upper cladding layer and being laterally undefined within an optical distance of said optical axis.

11. A window facet as recited in claim 10, wherein said window region includes said first upper cladding layer disposed below said additional upper cladding layer.

12. A window facet as recited in claim 10, wherein said additional upper cladding layer is disposed adjacent to said lower cladding layer.

13. A waveguide structure formed along an optical axis on a substrate, comprising:
a ridge waveguide region formed over said core layer and including a lower cladding layer formed on said substrate, a core layer, and a ridge including an upper cladding layer that is laterally defined for said ridge waveguide;
a transition region including
said lower cladding layer,
said core layer, and
part of said upper cladding layer that is substantially less laterally defined in said transition region than in said ridge waveguide region; and
a buried heterostructure region including
part of said core layer that is laterally defined, and said upper cladding layer.

14. The structure of claim 13, wherein said ridge waveguide region is an active region and said buried heterostructure region is a passive region.

15. The structure of claim 13, wherein said ridge waveguide region is a passive region and said buried heterostructure region is an active region.

16. The structure of claim 13, wherein said ridge waveguide region and said buried heterostructure region are both passive regions.

17. The structure of claim 13, wherein said ridge waveguide region and said buried heterostructure region are both active regions.

18. The structure of claim 13, wherein said first and second cladding layers are separately formed.

19. The structure of claim 13, wherein said upper cladding layer includes:
a first cladding layer that is laterally defined for said ridge waveguide and a part of which is less defined laterally in said transition region than in said ridge waveguide region; and
a second cladding layer formed at least partially over said first cladding layer in said transition region and is formed in said buried heterostructure region.

20. A process of forming a contact to ridge formed on a substrate and having on a top surface thereof a contact layer of a first composition, comprising the steps of:
depositing a masking material over said ridge so as to be substantially planar;
etching said masking material with an etching agent that etches said masking material but does not substantially etch the first composition forming said contact layer, said etching being performed to an extend that said contact layer is exposed but a bottom of said ridge is not exposed;
then depositing a first metallization of a second composition over said contact layer and said masking material; and
the removing said masking material and any contact material overlying it.

21. The method of claim 20, further comprising depositing and defining a second metallization into interconnections and pads and in contact with said first metallization.

22. The method of claim 20, further comprising an initial step of conformally depositing a dielectric layer over and around said ridge.

23. The method of claim 22, wherein said masking material comprises a bottom layer, an intermediate layer formed thereover at a level above a top of said ridge, and a top layer of a photoresist material formed over said intermediate layer, and further comprising the steps of:

patterning and developing said top layer to form an aperture therethrough, said developing not substantially etching said intermediate level; and thereafter etching through said intermediate layer and enough of said bottom layer to expose said contact layer.

24. The method of claim 23, wherein said bottom layer comprises a photoresist material.

* * * * *